United States Patent [19]

Hatada

[11] Patent Number: 4,996,583
[45] Date of Patent: Feb. 26, 1991

[54] STACK TYPE SEMICONDUCTOR PACKAGE

[75] Inventor: Kenzo Hatada, Katano, Japan

[73] Assignee: Matsushita Electric Industrial Co., Ltd., Osaka, Japan

[21] Appl. No.: 477,542

[22] Filed: Feb. 9, 1990

[30] Foreign Application Priority Data

Feb. 15, 1989 [JP] Japan .................................. 1-036822

[51] Int. Cl.⁵ ...................... H01L 23/48; H01L 23/54
[52] U.S. Cl. .......................................... 357/70; 357/68
[58] Field of Search ....................... 357/70, 69, 68, 75; 174/52.4; 437/206, 207, 208

[56] References Cited

FOREIGN PATENT DOCUMENTS

| | | |
|---|---|---|
| 59-136963 | 8/1984 | Japan ...................................... 357/75 |
| 61-63048 | 4/1986 | Japan ...................................... 357/75 |
| 62-226307 | 3/1989 | Japan ...................................... 357/75 |

Primary Examiner—Rolf Hille
Assistant Examiner—S. V. Clark
Attorney, Agent, or Firm—Stevens, Davis, Miller & Mosher

[57] ABSTRACT

In a semiconductor device, an outer lead is divided into plural leads at an outer lead region connected to an inner lead which is connected to an electrode terminal of a semiconductor chip, a plurality of TAB packages on which the semiconductor chip has been packaged are stacked in plural layers, at least one of the plural divided leads every stacked layers is left and a predetermined number of the divided leads are cut out, and these stacked TAB packages are mounted on a circuit board.

5 Claims, 6 Drawing Sheets

STACK TYPE SEMICONDUCTOR PACKAGE

BACKGROUND OF THE INVENTION

The present invention relates to a semiconductor device having such a structure that a plurality of packages packaged in the TAB method are stacked.

Very recently, a great demand for a higher density of electronic appliances is made. To satisfy such a demand, an arrangement as shown in FIG. 5 has been employed. FIG. 5 is a sectional view of an example of a conventional semiconductor device manufactured by the high density packaging A predetermined wiring pattern and electrodes 21a and 21b are formed on both sides of a circuit board 20. Each of wiring patterns formed on either side is electrically connected by a through hole (not shown) with each other. Packaged semiconductor chips 22a and 22b are mounted on both sides of the circuit boards 20. In accordance with such a conventional structure, a packaging density thereof becomes at least two times higher than that of the same plane area by mounting the packages on both sides of the circuit board 20.

In the conventional structure, however, since the packages are mounted on both sides of the circuit board in a plane form, only twice packaging density can be achieved. As a result, the more the number of the mounted chips increases, the higher the packaging area becomes. There is a problem that the higher density of the electronic appliances is impeded.

SUMMARY OF THE INVENTION

The present invention has been made in an attempt to solve the above-described problem, and has an object to provide a stack type semiconductor package capable of achieving more than two times higher packaging density.

Another object of the present invention is to provide such a structure that leads of stacked semiconductor devices can be readily connected to a board.

A still further object of the present invention is to provide a stack structure suitable for stacking a semiconductor memory device.

To solve the above-described subject, a structure of the present invention is that in an outer lead region connected to an inner lead which is connected to an electrode terminal of a semiconductor chip, the outer lead is divided into plural leads; a plurality of TAB packages for packaging the semiconductor chip are stacked; at least one of the divided leads remains at each of stacked stages; a predetermined quantity of other divided leads are cut off; and the stacked TAB packages are mounted on a circuit board.

In accordance with the above-described structure of the present invention, the semiconductor chips can be easily stacked on the circuit board with two or more stacked layers, and terminals other than the common terminals can be readily connected to the electrodes of the circuit board under this condition. As a result, it is possible to obtain such a package in which the semiconductor chips are stacked in a multi layer, and thus to realize more than twice packaging density.

DESCRIPTION OF THE PREFERRED EMBODIMENTS

In case that a plurality of LSI memory chips are mounted on the same circuit board, for electrodes commonly used for each chip such as a power source, a clock signal line, and the like, the same electrodes of these chips can be commonly connected to each other and to wiring patterns formed on the circuit board. However, non-common electrodes such as electrodes for selecting chips are separately derived from the respective chips, and are required to be connected to specific wiring patterns formed on the circuit board. There exists such a subject when a plurality of LSI memory chips are stacked. A description will now be made to the following preferred embodiments according to the present invention, in which the connecting treatments of both the common electrodes and non-common electrodes have been considered.

Figure 1:
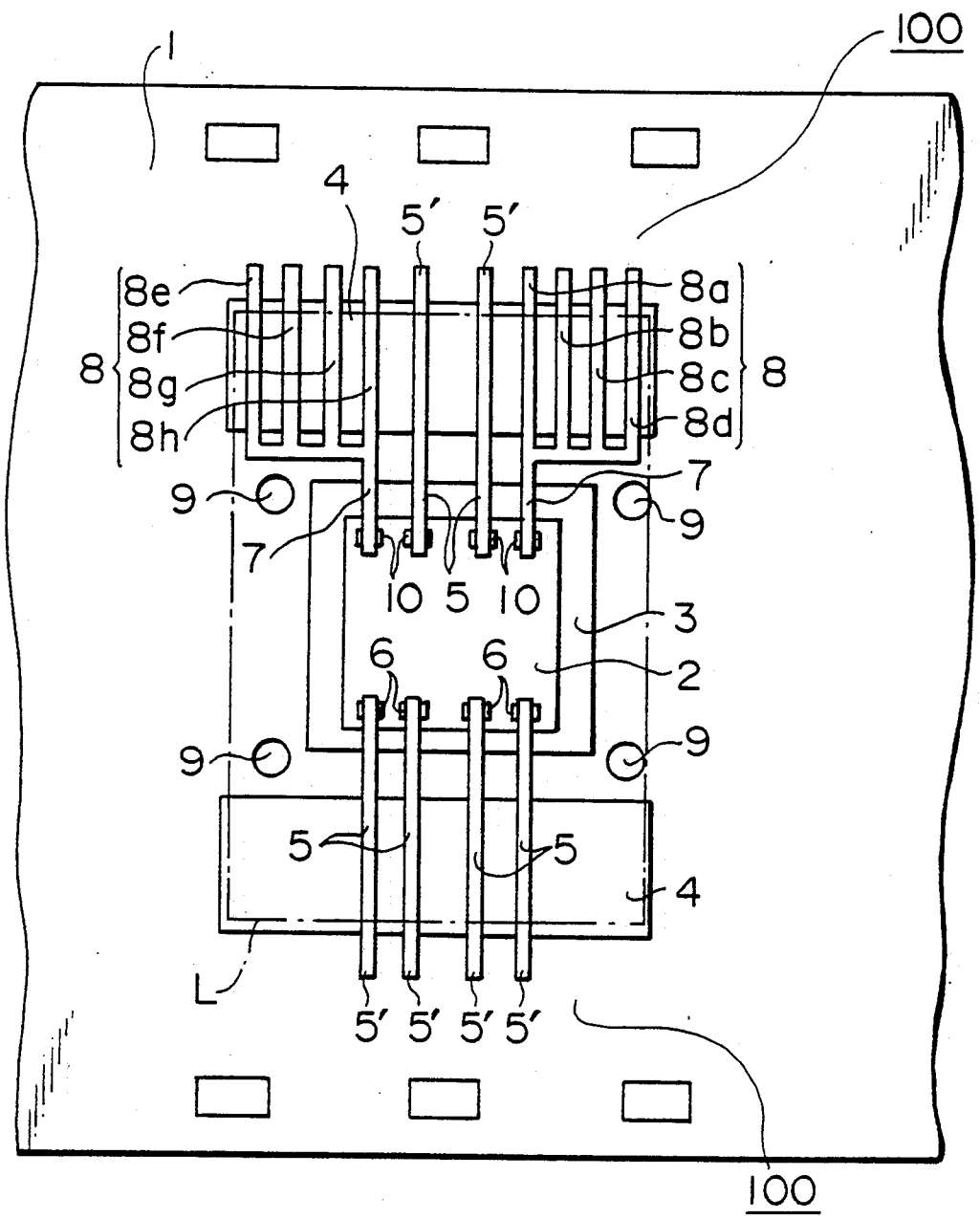
FIG. 1 is a plan view of a TAB package constituting a portion of a structure of a semiconductor device according to a preferred embodiment of the present invention.

FIG. 1 is a plan view of a TAB package constituting a portion of a structure of a semiconductor device according to one preferred embodiment of the present invention.

Figure 3:
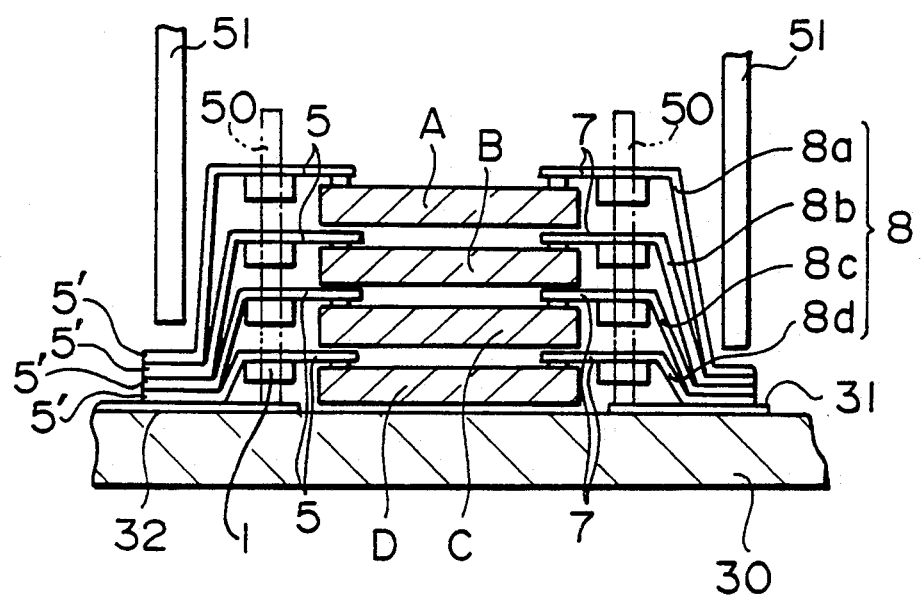
FIG. 3 is a sectional view for showing a packaging condition that the TAB package on which the respective LSI chips have been packaged is stacked.
Figure 4:
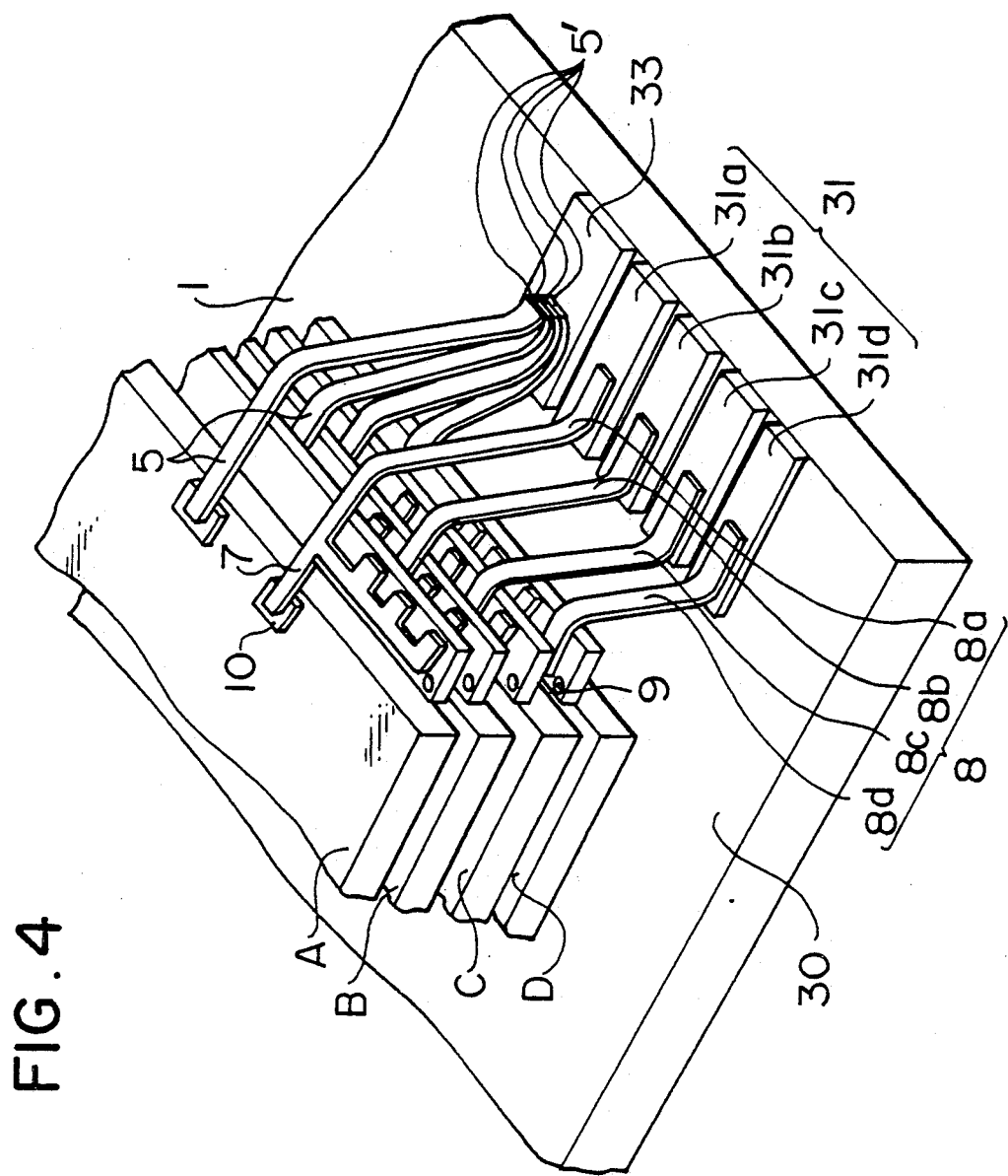
FIG. 4 is a perspective view of a major portion of the TAB package.
Figure 5:
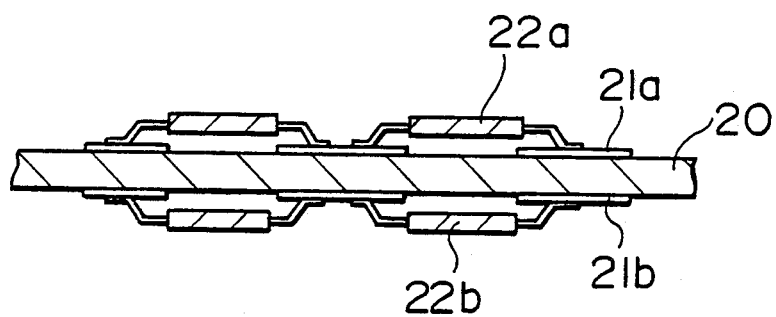
FIG. 5 is a sectional view of the conventional high-density packaged semiconductor device.

Referring now to FIGS. 3 and 4, a description will be made to this preferred embodiment in which four chips of memory LSI chips are stacked.

In FIG. 1, at least a device hole 3 and an outer lead hole 4 are opened on a resin film (film carrier tape) 1 such as polyimide and glass epoxy (epoxy containing a glass fiber), and inner leads 5 and 7 which are formed by copper foils and plated are arranged which a projected form on the device hole 3. It should be noted that a lead 100 is constructed of the inner leads 5 and 7, and outer leads integrally formed with these inner leads. A region of the outer lead 8 is divided into a plurality of outer leads 8a to 8h. In the construction example shown in FIG. 1, a chip 2 has eight electrodes to which eight inner leads have been connected respectively. FIG. 1 represents such a condition that electrodes 6 and 10 of the LSI chip 2 have been connected to the inner leads 5 and 7. Both the LSI chip 2 and inner leads 5, 7 make a junction between the leads 5, 7 and a bump (metal projection) formed on the electrodes 6 and 10 on the chip 2, or form a bump on the leads 5 and 7. These chips and inner leads are connected by making a junction between this bump and electrodes 6 and 10. In each of LSI chips to be stacked, the leads 5 and 5' for processing the same signals of electrodes at the same position on the chip 2, namely common terminals correspond to terminals of a power source and a clock signal, and are continuously formed in a single form via an inner lead region connected to the electrode of the LSI chip 2 and also a subsequent outer lead region. On the other hand, in each of the LSI chips to be stacked, a lead for processing different signals at an electrode 10 at the same position on the chip 2, namely a non-common electrode terminal for selecting a chip used for inputting/ outputting signals into/from the respective chips, is formed as a single lead at least in an inner lead region, i.e., an inner lead 7. However, this lead is formed as lead groups (outer leads) 8a to 8h in an outer lead region 8 in which the inner lead 7 has been divided by the number of the chips to be stacked.

A hole 9 is formed on an arbitrary position of the film carrier tape 1. It should be noted that although a single LSI chip 2 is represented in FIG. 1, a plenty of chips shown in FIG. 1 have been mounted on the tape 1 in the longitudinal direction. That is to say, a plenty of LSI chips 2 are packaged on the inner leads 5 and 7 of the film carrier tap 1 in the longitudinal direction, and electrically inspected. Under the condition shown in FIG. 1, a protective resin film (not shown) is formed on the chip 2, and is cut off in a predetermined form at a portion of, for example, a dot line "L" before mounted on the circuit board, so that each of TAB packages is formed.

Figure 2A:
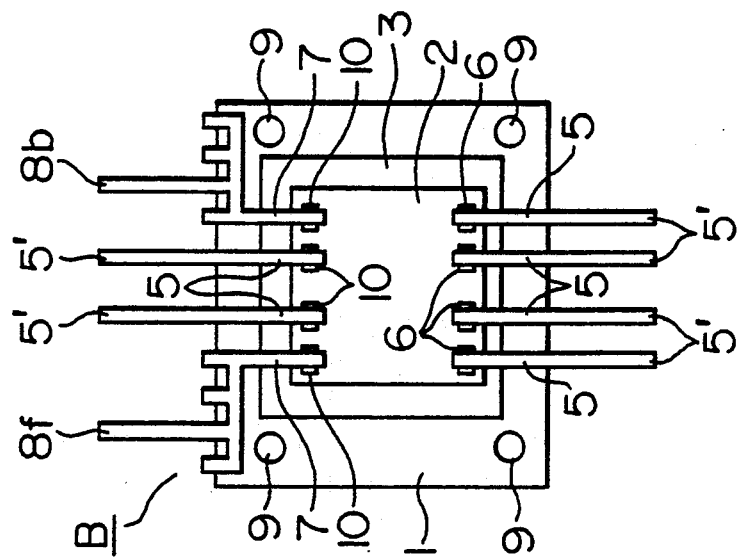
FIGS. 2a to 2d are plan views for representing such conditions that the TAB packages on which LSI chips to be stacked have been packaged are cut off in a predetermined form for each stacked layer.
Figure 2B:
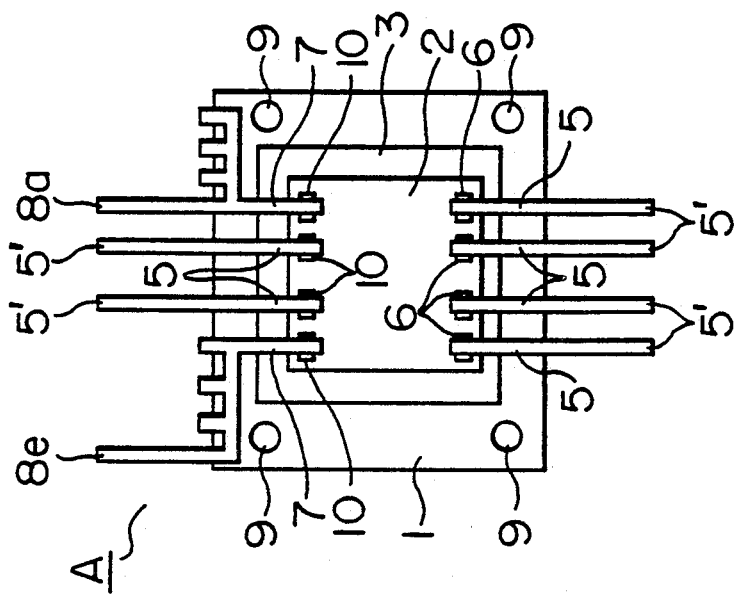
Figure 2C:
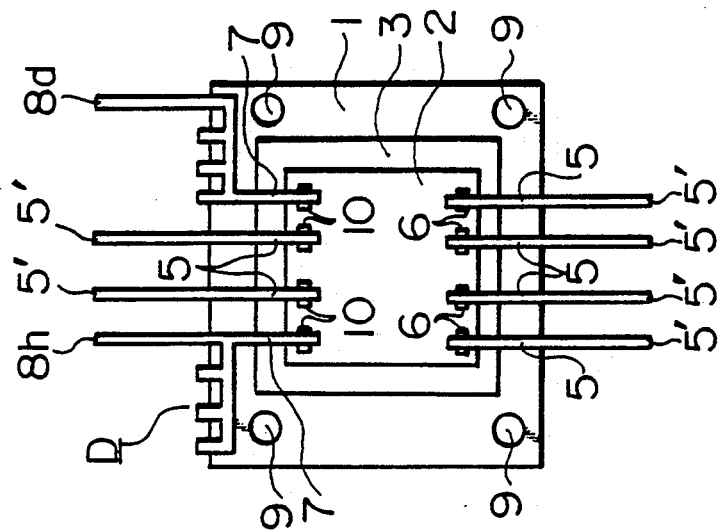
Figure 2D:
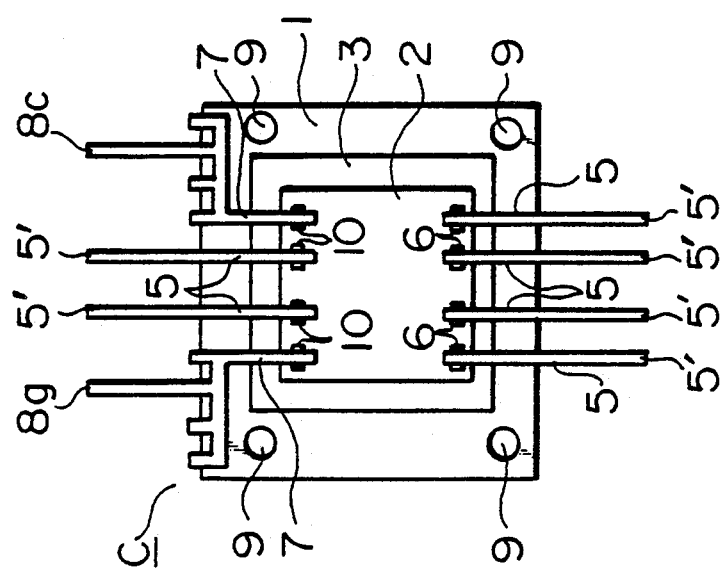

FIGS. 2a to 2d are plan views for representing such a condition that the film under the condition of FIG. 1 is cut off in a predetermined form, and the TAB packages of the respective layers, on which the LSI chips to be stacked have been packaged. In a TAB package "A" on which LSI chips to be stacked have been packaged, all of the outer leads (8b, 8c, 8d, 8f, 8g and 8h) of the electrode 10. Other than the outer leads 8a and 8e have been cut off (FIG. 2a. In a package "B" on which the LSI chips to be stacked have been packaged, the outer leads 8a, 8c, 8d, 8e, 8g and 8h of the electrode 10 at the same position as in the chip "A" are cut off, and only the outer leads 8b and 8f remain (FIG. 2b). Similarly, in a package "C" on which the LSI chips to be stacked have been packaged, the outer leads 8c and 8g are left, and in a package "D" on which the LSI chips have been packaged, the outer leads 8d and 8h are left, the remaining leads are cut off (FIGS. 2c and 2d). As previously described, the shapes of the cut outer lead 8 are different from each other every stacked layer of the LSI chip. Such a selective cutting operation of the outer lead 8 is simultaneously performed by utilizing, for instance, a punching die when each of the chips 2 is cut out from the film carrier 1 after the LSI chip 2 has been packaged on the film shown in FIG. 1. Otherwise, after the chip 2 has similarly been cut off in a predetermined shape with a preselected die, only the outer lead 8 may be cut at a different stage.

When all of the respective TAB packages "A" to "D" having the structures shown in FIG. 2 are stacked, the outer lead 8a, 8b, 8c, 8d, 8e, 8f, 8g and 8h conducted from the electrodes 10 of the respective packages, functioning as non-common electrodes are not overlapped under the stacked condition. As a consequence, signals can be separately input/output into/from the outer leaders stacked under such a condition.

FIG. 3 is a sectional view for representing such a packaging condition that TAB packages on which LSI chips have been packaged are stacked. FIG. 4 is a perspective view of a portion of a stacked package condition. In this structure, a guide pin 50 is inserted into a hole 9 so as to position an outer lead among each package when tape carrier packages are stacked, TAB packages "A" to "D" having packaged four LSI chips A, B, C, D are stacked and provided on a circuit board 30, and as previously described, the outer leads which have been conducted without any overlap are connected to each of electrode wiring patterns formed on the circuit board 30. In FIGS. 3 and 4, there are shown such conditions that the respective leads 8a, 8b, 8c and 8d are connected to the respective electrode wiring patterns 31a to 31d of the board. With respect to the connection in this case, a temperature is instantaneously increased by employing, for example, a pulse tool and a solder layer is reflown so as to make such a connection. Also, as to the formings of the leads of the stacked LSI chips, since the leads theirselves are thin and soft, they can be simply formed in various shapes. It should be noted that even when the forming process of these outer leads 8a, 8b, 8c, 8d is not performed before this connection, the outer leads are brought into such a condition that they are merely cut out from the film carrier 1 (under condition that the leads are conducted in the same direction as the chip plane), and the leads of the respective chips may be forming-processed, as represented in FIG. 3, by depressing the leads with, for instance, the pulse tool 51 when the respective chips are mounted on the circuit board 30.

It should be noted that the leads 5' conducted from the common terminals of the respective LSI chips are wholly connected to the electrode of the circuit board under such a condition that these leads are overlapped with each other at the same position.

As previously, described, a plurality of extremely thin TAB packages on which the LSI chips have been packaged may be easily stacked on the circuit board at the higher density. Then, except for the common terminals of the respective chips, the non-common terminals (outer leaders) may be conducted to the different positions on the circuit board. Furthermore, since the outer leads have been accomplished when the TAB packages are formed, no extra treatment is required when being packaged to the circuit board, and no work for employing other components is required.

In the examples shown in FIGS. 3 and 4, when a semiconductor memory chip is employed as the chip, an instruction signal is first input into the lead 8a in case that a signal input/output operation is performed for a chip "A". As a result, the signal can be input into only the chip "A". Similarly, in case that a signal input/output operation is carried out for, for instance, a chip "0", an instruction signal is input by the lead 8d. Under such a way, each of the stacked chips can be freely selected by employing the leads 8a to 8d functioning as chip selection terminals.

When, for instance, 256K DRAM, 1M DRAM and 4M DRAM are employed as the chips of the structures shown in FIGS. 3 and 4, and four chips for each DRAM are stacked, memory packages each having a DRAM capacity of 1M, 4M and 16M bits can be obtained. Then, this package corresponds to a TAB package having a thickness of approximately 445 micrometers per a single and directly stacked, so that the very thin and compact package can be formed and only a single area is required for the entire package.

It should be noted that the above-described memory chips are not limited to DRAMs, but the present invention may be applied to SRAM and ROM and the like. It is apparent that the present invention may be applied to components other than the memory chip. Then, the stack number of the LSI chips are not ristricted to four, but may be two or more according to the present invention.

As apparent from the foregoing descriptions, the semiconductor chips can be readily stacked on the circuit board, and the lead terminals thereof can be simply connected to the circuit board according to the present invention. Since the package according to the present invention is manufactured by employing the TAB technique, a plurality of outer leads can be formed in a fine pitch by separating a single inner lead, and the unnecessary leads can be simply cut off. Also, in accordance with the present invention, since a plenty of chips can be processed with a package area required for at least a single chip even when these chips are mounted, there is a particular advantage that the packaging density can be considerably increased, and also a very useful technique can be achieved in an industrial field.

What is claimed is:

1. A semiconductor device, comprising: an outer lead region connected to an inner lead which is connected to an electrode terminal of a semiconductor chip, said outer lead region comprising plural divided leads each connected to said inner lead; a circuit board; a plurality of TAB packages, said semiconductor chip being packaged in said TAB packages, said TAB packages being stacked in plural layers; said stacked TAB packages being mounted on said circuit board; at least one of said plural divided leads being provided at each of said stacked layers and a predetermined number of said plural divided leads being cut out of each of said stacked layers.

2. A semiconductor device as claimed in claim 1, wherein the number of the plural leads which are continuous with said inner lead and divided at the outer lead region is equal to the number of leads of the stacked layers.

3. A semiconductor device as claimed in claim 1, wherein positions of the plural divided leads which are provided without being cut out at said stacked layers are different for each package of the respective stacked layers to avoid interfering with said at least one of said plural divided leads which is provided at each of said stacked layers.

4. A semiconductor device as claimed in claim 1, wherein a hole is formed in a resin tape adjacent to the outer lead region and a guide pin is inserted into said hole so as to position the plural outer leads between each package when the TAB packages are stacked.

5. A semiconductor device as claimed in claim 1, wherein said semiconductor chip corresponds to a memory chip, and the outer lead which has been divided into plural leads correspond to terminals for supplying chip selection instructing signals.

* * * * *